(12) United States Patent
Babin et al.

(10) Patent No.: US 6,420,717 B1
(45) Date of Patent: Jul. 16, 2002

(54) METHOD AND APPARATUS FOR REAL-TIME CORRECTION OF RESIST HEATING IN LITHOGRAPHY

(75) Inventors: Sergey Babin, Castro Valley; Robert Innes, Richmond, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/547,173

(22) Filed: Apr. 11, 2000

(51) Int. Cl.$^7$ ............................................. H01J 37/304
(52) U.S. Cl. ...................... 250/492.2; 430/30
(58) Field of Search ........................... 250/492.2; 430/30

(56) References Cited

U.S. PATENT DOCUMENTS 6,238,830 B1 * 5/2001 Rangarajan et al. ..... 250/492.2

\* cited by examiner

*Primary Examiner*—Kiet T. Nguyen
(74) *Attorney, Agent, or Firm*—Jung-Hua Kuo; Skjerven Morrill MacPhearson, LLP.

(57) ABSTRACT

The present invention relates to methods and procedures for determining resist temperature during energy beam lithography and adjusting process parameters, including reducing the beam current, to compensate for increased resist sensitivity due to heating. The present invention relates to methods of predicting resist heating in real-time as the writing proceeds thereby enabling beam compensation to be performed in real-time. A linear superposition approximation is described that provides a procedure for estimating the resist temperature at the point presently being written from previously written points. The present invention makes use of the thermal history of the pattern previously written as that history is recorded in the line of pixels immediately preceding the line whose temperature is to be determined prior to e-beam exposure, and a single number representing the thermal history of lines written before the immediately preceding line. The iterative methods for calculating resist heating in the present invention may be implemented digitally on a variety of devices. In addition, specific analogue circuitry to reproduce this iterative method is described, leading to rapid calculations of resist heating. Advantages of the present invention include the prevention or mitigation of pattern blooming as incident electrons heat the resist and broaden the region of exposure.

8 Claims, 11 Drawing Sheets

METHOD AND APPARATUS FOR REAL-TIME CORRECTION OF RESIST HEATING IN LITHOGRAPHY

BACKGROUND OF THE INVENTION

1. Technical Field

This invention relates to the general field of electron beam lithography and, more particularly, to real-time correction of the lithography process to compensate for heating of the resist by thermal diffusion from areas previously written, and most particularly to methods and apparatus for calculating resist heating in real-time, sufficiently rapidly to permit correction of the lithography process.

2. Description of Related Art

The production of precise patterns on surfaces is a necessary stage in the fabrication of integrated circuits, and finds applicability in many other commercial environments as well. The typical method for creating such patterns is to coat the surface to be patterned with a chemical that undergoes a chemical transformation upon exposure to energy, a "resist." Positive resists undergo chemical transformation on exposure to energy leading to removal of resist from the surface to be etched in the regions so exposed. Negative resists undergo other chemical transformations, such as cross-linking, leading to removal of resist in regions not exposed to energy. Both positive and negative resists are commercially useful. Thus, exposing a resist-coated surface to the appropriate pattern of energy leads to selective removal of resist according to that pattern (exposed or masked), uncovering selected regions of the underlying surface to further chemical etching in a subsequent etching step. Removal of all resist following surface etching leads to the desired pattern etched into the surface.

The energy incident on the resist is typically either electromagnetic or a beam of particles, typically ions or electrons ("e-beam"). In addition, the energy may be directed onto the resist in one of two general ways: 1) through a mask having both transparent and opaque regions therein permitting selective passage of the incident energy to create the desired pattern of exposure on the underlying resist, or 2) as a focused beam, guided so as to impact selectively only those areas requiring exposure. Exposure through a mask is the presently preferred technique for producing numerous identical patterns at reduced costs. However, the mask itself must first be made, most commonly by focused beam impact. Thus, focused beam exposure of resists remains a necessary step in the production of masks for lithography.

Direct beam "writing" of patterns onto resists has several advantages over use of a mask. Among these are avoiding the complications of alignment and registration of the mask and more precise patterning accomplished by precisely focused beams. Thus, beam lithography finds applicability in many areas of technology in addition to mask creation. However, the discussion herein will be particularly directed to e-beam lithography for the production of masks, although other applications for the methods described herein will be apparent to those having ordinary skills in the art. For economy of language we will describe e-beam lithography as typically used in the manufacture of masks, not intending thereby to limit the scope of the invention merely to electrons.

Precise patterning requires precise exposure of resist. For concreteness of our description, we will consider the case of positive resists, which are removed from the underlying layer for subsequent etching where the positive resist is exposed to the incident e-beam. Completely analogous effects are present for negative resists as well understood in the art. A sharp boundary is desired between exposed regions and unexposed regions for both types of resist, permitting the mask designer to use more densely packed components without interference and overlap of imprecisely exposed adjacent patterns.

Precise exposure of resist requires a detailed understanding of the sensitivity of the resist to e-beam exposure. The exposure of resist to an e-beam, called the dose, is typically measured in microcoulombs per square centimeter ($\mu C/cm^2$). The sensitivity of the resist means the electron dose (in $\mu C/cm^2$) necessary to create the desired pattern in the resist upon development. This sensitivity is a function of the resist composition, the energy of the incident electron beam, the temperature of the resist, the resist development process and other factors as well. The changes of resist sensitivity with its temperature at the time writing occurs is a particular concern of the present invention.

Scanning the entire surface to be exposed typically involves scanning of the electron beam over a limited area while mechanical translating the surface over a much larger area. Electron beam scanning typically involves rapid transitional motion of the beam across the surface (up to approximately 10,000 cm/sec), but only covering a small region of the surface (typically around a millimeter in lateral extent). The entire substrate is moved mechanically at about 1 cm/sec but over an extent of lateral traverse sufficient that the e-beam exposes the entire surface.

It is helpful to emphasize that exposure of the resist by e-beam impact and heating of the resist are two conceptually distinct phenomena. The chemical activity of the resist leading to its useful lithographic properties is initiated by e-beam impact. The efficacy of electrons in causing this chemical activity is defined as the sensitivity of the resist. The sensitivity of the resist to e-beam impact depends in turn on many factors including the temperature of the resist at the time it is exposed. Thus, changing the temperature of the resist changes its sensitivity which may require changing the dose of electrons in order to achieve proper exposure. Failing to take into account changes in resist sensitivity with temperature may lead to overexposure of the resist, exposure of the resist in regions not intended to be fully exposed, and less precise patterns. Pattern "blooming" is the undesired result.

Heating of the resist occurs in two ways: 1) As an inherent adjunct effect to the impact by electrons intentionally directed onto the resist for exposure. This heating is always present in e-beam lithography and is taken into account when the resist is calibrated to specify the correct exposure. 2) In high voltage lithography, most of the electron beam energy passes through the resist and the underlying mask layer (typically very thin) and penetrates the substrate where most of the energy is deposited as heat. (An exception occurs when thin substrates are used, typically in the manufacture of X-ray masks, where the substrate is itself a film so thin that most of the beam energy passes through it). Electron diffusion in a thick substrate deposits the heat from a single e-beam flash in the substrate, typically in a volume 10 or more microns (micrometers) in lateral extent (perpendicular to the e-beam direction). Subsequent thermal conduction transports a portion of this heat to the substrate surface where it heats the resist in a zone that may be tens of microns in lateral extent a few microseconds following the flash, increasing to a millimeter across after several milliseconds. (Exact numbers will depend on beam energy, the composition of the substrate and its thermal properties). Thereafter the heat has diffused so much as to have no significant effect on resist exposure. It is this second type of heating that this invention addresses and denotes as "proximity heating" or "resist heating." Such resist heating depends on the previously written pattern and the time history of the pattern writing. This variability makes resist heating particularly challenging to estimate in designing a process for high accuracy e-beam writing.

"Proximity heating" or "resist heating" as used herein is not to be confused with the "proximity effect" related to the chemical effects of scattered electrons in the resist. Electrons in a beam passing through matter will from time to time encounter atomic nuclei or orbital electrons and undergo deflection from their line of travel, with or without loss of energy in the deflecting collision. The "proximity effect" relates to the chemical effect these scattered electrons have exposing the resist, perhaps relatively far from the intended exposure zone at which the e-beam is directed. Scattered electrons within the resist may lead to exposure away from the desired exposure zone. Backscattered electrons from layers below the resist may re-enter the resist and also produce deleterious exposure. Many approaches have been suggested to ameliorate the effects of these scattered electrons as they lead to unwanted exposure of the resist. Bohlen et. al. (U.S. Pat. Nos. 4,426,584 and 4,504,558) suggest a second exposure to the incident e-beam designed to correct for dosage losses or (for e-beam exposure through a mask) the use of two complimentary masks. Several ways to correct for the electron beam dosage have been suggested, including the work of Watson (U.S. Pat. No. 5,736,281), Ashton et. al. (U.S. Pat. No. 5,051,598), Owen et. al. (U.S. Pat. 5,254,438), and Chung et. al. ( U.S. Pat. No. 5,432,714). In all cases, however, the focus of this work is to prevent or reduce the chemical effect of scattered electrons in causing undesired exposure of the resist. In contrast, the present invention relates to the thermal effect of both incident electrons and scattered electrons as they heat the target indirectly by conduction of heat deposited elsewhere, and the changes in resist sensitivity caused by this heating.

Calculations of resist heating are typically based upon a numerical solution of the appropriate diffusion (partial differential) equations. Heat sources caused by electron impact may be represented by analytic approximations, or derived directly by numerical Monte Carlo simulation of the electrons as they penetrate into targets, including resists, depositing their energy therein. Many prior methods have proven in practice to be too slow in comparison with the speed of e-beam writing to allow real-time computation of resist heating and adjustment of the writing process in response. The present invention provides methods for rapidly predicting resist heating on a time scale comparable with the e-beam writing speeds. This real-time prediction of resist heating allows the properties of the e-beam and/or the writing process to be adjusted while writing is underway to compensate for resist heating.

Resist heating has been the subject of several calculations and measurements. Ralph et. al. describe methods for computing resist heating by numerical integration of diffusion equations in "Proceedings of the Symposium on Electron and Ion Beam Science and Technology, Tenth International Conference", p. 219–2330 (1983). Babin et. al. also describe methods for the numerical simulation of resist heating and the comparison of such calculations with measured values. SPIE, Vol. 3048, p. 368–373 (1997) and J. Vac Sci Technol. B Vol. 16, pp. 3241–3247 (1998). Additional calculations of resist heating and comparison with measured values have been reported by Yasuda et. al. in and J. Vac Sci Technol. B Vol. 12, pp. 1362–1366 (1994).

Several approaches have been taken to calculate and/or correct for resist heating and to formulate methods for performing such calculations in real-time. These include the work of Veneklasen et. al. (U.S. Pat. No. 5,847,959 and the pending patent application of Innes et. al. (09/343,960, commonly assigned with the present application). The present invention is an alternative method for estimating and correcting for resist heating that may be implemented on a general digital purpose computer, Field-Programmable-Gate-Array, Digital Signal Processor, etc. Very rapid calculations of resist heating result. Dedicated analogue hardware is also described that permits the resist heating of the resist to be calculated according to the procedures of the present invention very rapidly in real-time, allowing for the correction of the patterning process also in real-time.

SUMMARY OF THE INVENTION

Precise writing of patterns in a resist requires precise exposure of the resist which, in turn, requires precise knowledge of the sensitivity of the resist to e-beam impact. Resist sensitivity depends upon the temperature of the resist at the time of writing. Thus, the present invention relates to methods and procedures for determining resist temperature during processing and adjusting process parameters, including reducing the beam current, to compensate for increased resist sensitivity. Typically, the resist temperature rise predicted by the present invention for the point of writing will be multiplied by a factor relating the temperature sensitivity of the resist. The result is a correction applied to the beam current (or dwell time) to provide more accurate resist exposure. The correction will typically be a multiplicative factor less than 1 (for most positive resists) by which the beam current is to be adjusted to correct for resist heating at the point of writing. In an analogous manner, corrections to beam dwell time may be used alternatively or in addition to beam current corrections. It is envisioned that e-beam current or the dwell time of each spot or "flash" may be adjusted. Pattern blooming is thereby reduced.

The present invention relates to methods of predicting resist heating in real-time as the writing proceeds thereby enabling beam compensation to be performed in real-time. Methods of achieving high processing efficiency are described.

A linear superposition approximation is described that provides a procedure for estimating the resist temperature at the point presently being written from previously written points. These techniques are most effective in the case of raster or serpentine scanning in which the e-beam scans over every line in sequence, creating the desired pattern in the resist by depositing the correct amount of energy (including zero energy) at each point (pixel) in turn. Thus, for raster or serpentine scanning there is a definite and known relationship between the time of writing each pixel and that pixel's location on the surface. By "writing" we mean directing the e-beam towards a particular pixel on the surface, whether or not any energy is deposited. This is in contrast to "vector scanning" in which the e-beam is directed to certain regions requiring non-zero energy exposure and skips other regions entirely. Prediction of resist heating for vector scanning is more complex due to this unknown relationship between the time and location of writing pixel i and the time and location of writing pixel j. Knowing i, j and the properties of the equipment allows one to know precisely for raster or serpentine machines the time and distance relationship between any two pixels, i,j.

The present invention makes use of the thermal history of the pattern previously written as that history is recorded in the line of pixels immediately preceding the line whose temperature is to be determined prior to e-beam exposure, and a single number representing the thermal history of lines written before the immediately preceding line. That is, the temperature of line 2 (the second line written) is determined from a knowledge of the thermal history of line 1 (the first line written) and the time and distance dissipation of heat at the location and time of writing line 2. Resist temperatures at the time and location of writing line 3 are determined only from knowledge of the thermal history of line 2, and a single taking into account thermal effects arising from previously written lines. Therefore, in this approximation, the temperature of the resist at the time and location of writing line i is determined from the properties of the immediately preceding line, line (i–1) and a single numerical parameter. The thermal effects of lines (i–2), (i–3) . . . 1 on line i have been iteratively accumulated in the properties of line (i–1) and in the parameter The iterative methods for calculating resist heating in the present invention may be implemented digitally on a variety of devices. In addition, specific analogue circuitry to reproduce this iterative method is described, leading to rapid calculations of resist heating. Advantages of the present invention include the prevention or mitigation of pattern blooming as incident electrons heat the resist and broaden the region of exposure.

DESCRIPTION OF THE DRAWINGS

The figures herein are not drawn to scale.

DETAILED DESCRIPTION OF THE INVENTION

The general mode of operation of e-beam lithography makes use of a focused beam of electrons, accelerated through a voltage, typically 1000 volts (1 kV) and above. Lower voltage e-beams are more effective at exposing the resist. Higher voltage e-beams are preferred for their ability to be formed into more precisely focused beams, resulting in more accurate lithography and the ability to fabricate smaller patterns. "High voltage" e-beams herein is commonly understood to mean e-beam energies above approximately 10 kV. Beam energies as high as 50–100 kV are used. However, high energy e-beams produce undesired heating side effects, the amelioration of which is one object of the present invention.

Figure 1:
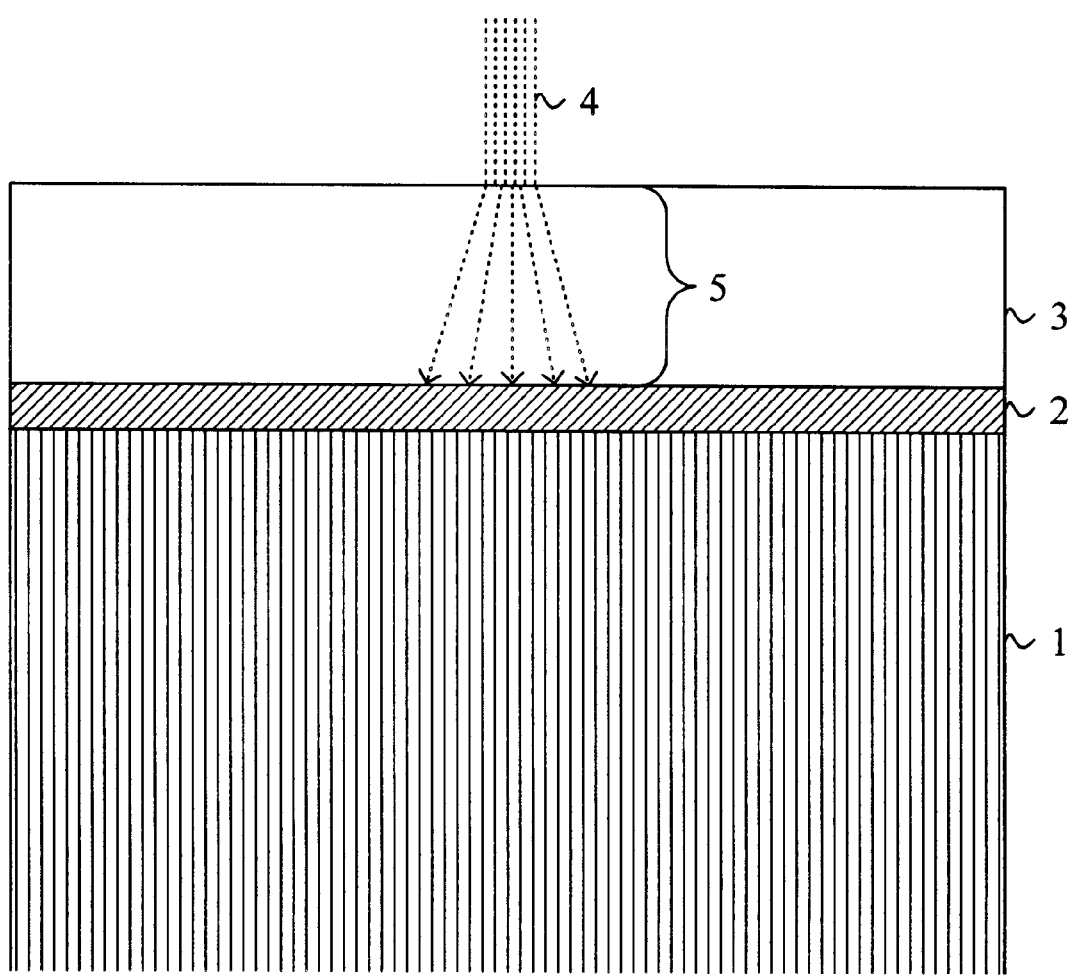
FIG. 1: Schematic cross sectional view of low energy e-beam impact on substrate, mask to be etched and resist.

FIG. 1 depicts schematically and in cross section a beam of low energy electrons (less than approximately 5 kV), 4, incident on a layer of resist, 3. Typically, resist layer, 3, will be relatively thin, around 0.5 $\mu$m ("microns"=$10^{-6}$ meter). Resist, 3, overlies the layer to be etched, 2, all of which typically are supported by a reasonably thick substrate, 1. For the manufacture of lithography masks, layer, 2, will be generally be the mask material, typically a film of proprietary composition containing chromium and commonly very thin compared to the resist layer. Substrate 1 is typically glass and may be considered to be infinitely thick as none of the effects encountered in e-beam lithography relevant to the invention described herein are affected by the lower surface of a thick glass layer, 1 (not depicted in FIG. 1). Very thin substrates, as would typically be encountered in the fabrication of x-ray lithography masks, are an exception. FIG. 1 (in common with all other figures herein) is schematic only and not drawn to scale.

For a low energy beam as depicted in FIG. 1, significant dissipation of energy and spreading of the e-beam occurs in the resist layer, commencing virtually immediately upon impact with the resist surface, as depicted in FIG. 1. The spreading of low energy e-beams in width may be commensurate with the depth of penetration. Thus, low energy e-beams tend to scatter in the resist layer, exposing thereby a larger range of resist than desired and exposing the resist in different patterns than intended, broader than the incident beam. This "pattern blooming" is the result of the chemical interaction of scattered electrons with the resist or the "proximity effect." Backscattering from layers underlying the resist layer also leads to unwanted exposure and pattern blooming. The creation of a precise patterns on layer 2 is facilitated by minimal spreading of the e-beam on passage through the resist, 3, which favors the use of higher energy beams.

Use of high energy beams requires both higher voltage and higher beam currents. Low energy e-beams deposit a reasonably large fraction of the beam energy in the resist layer where it is needed to expose the resist. Therefore, low energy e-beams require less incident beam intensity (beam current) since more efficient use is made of the available beam intensity in developing the resist. The energy deposited in the target is thus typically significantly less for low energy e-beams since both current and voltage are reduced from that used in high energy e-beam lithography. That is, energy deposited is the product of beam voltage * beam current * exposure duration.

By way of illustration and not limitation, we compare the exposure of resist by a 10 kV beam with that caused by a 50 kV beam. It is noticed experimentally that as beam energy increases the current must increase almost linearly with beam energy to continue to expose the resist adequately. Thus, increasing the beam energy by a factor of 5 from 10 to 50 kV requires a concomitant increase in current or exposure duration by a factor of approximately 5 to adequately expose the resist. The energy deposited per e-beam pulse (or flash) is volts * amps * (pulse duration) which increases by a factor of approximately 25 in this example for equal pulse lengths.

Figure 2:
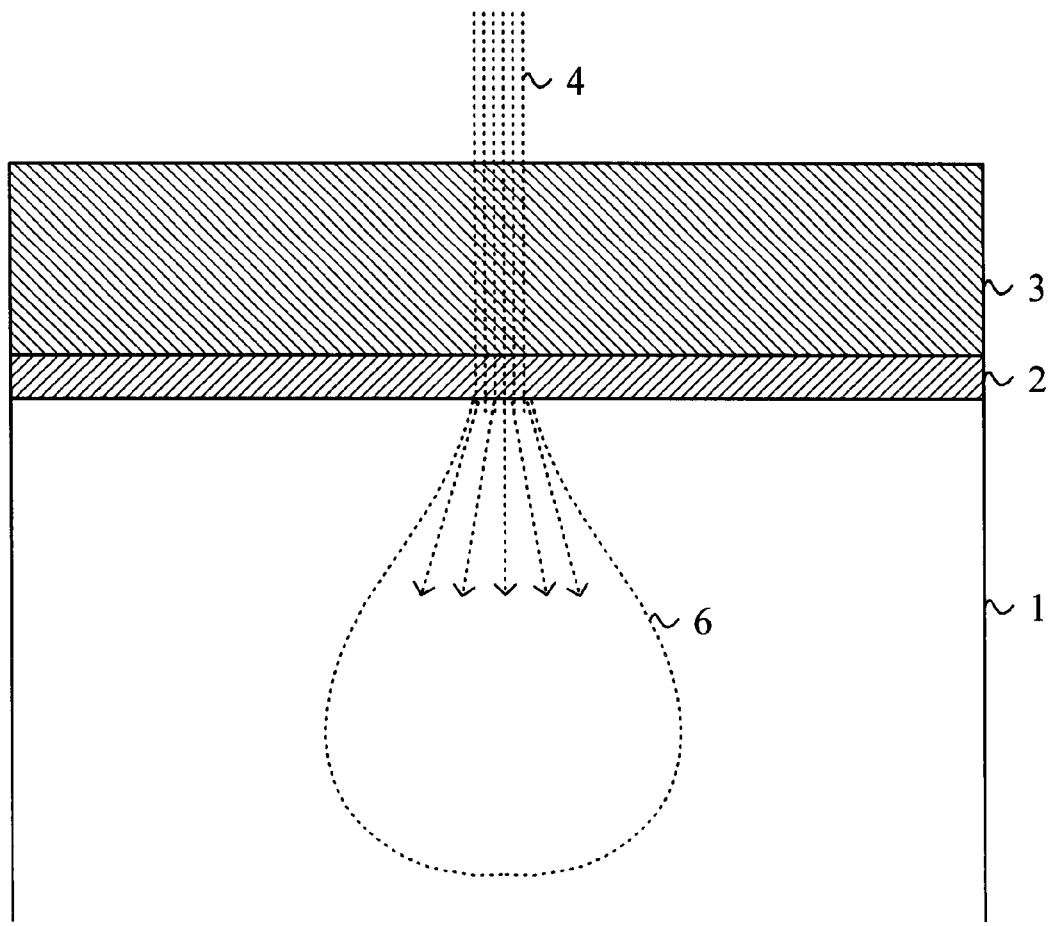
FIG. 2: Schematic cross sectional view of high energy e-beam impact on substrate, mask to be etched and resist.

FIG. 2 depicts schematically in cross section (not to scale), e-beam, 4, incident on resist, 3, at high incident beam energies, typically round 50 kV. Beam spreading depicted as in FIG. 1 is typically negligible in the resist layer, 3, for high energy beam impacts as depicted in FIG. 2. Such high energy beams tend to pass through resist layer, 3, mask layer, 2, and proceed well into the glass substrate, 1, before substantial beam spreading occurs. A heated zone, 6, is thereby created in substrate 1 as the e-beam comes to rest. Typically, for electron beam energies of about 50 kV, zone 6 will be approximately 20 $\mu$m in diameter with its centroid about 10 $\mu$m below the upper surface of glass substrate, 1, and for small flashes or round spots, have rotational symmetry about the vertical axis defined by the incident e-beam, 4.

As noted above, high voltage e-beams will typically deposit much more energy in substrate, 1, than will low voltage beams, such energy increasing by approximately the square of the beam energy (as the need for increased current must also be met). The energy per pulse may not be substantial, but millions or indeed hundreds of millions of pulses impact the substrate in fully exposing the resist. Therefore, substantial heating of the substrate, 1, may occur with high energy electron beams. Direct heating of the resist layer by the incident e-beam passing through may be significant, but is readily predictable from the applied dose and, therefore, can be compensated by calibration. However, resist heating of the point at which writing is currently occurring is variable since it is affected by conduction from regions within the substrate where heat was deposited by numerous (typically millions) of earlier pulses. Thus, resist heating depends on the pattern being written and the timing and ordering of past pulses. The present invention evaluates the resist temperature at the point of writing due to resist heating effects, and provides the data enabling appropriate beam adjustments.

Raster scan electron beam lithography machines typically scan the electron beam in a linear path about 1 mm in length every 25 microseconds as the mechanical stage moves the substrate in an orthogonal direction at a speed of about 1 cm/sec. The time between the end of one beam scan and the start of the next is about 5 microseconds, called "flyback time." The scan sequence may be raster or serpentine, writing in one direction only or performing bi-directional writing respectively. The temperature of the resist due to earlier writing may vary by tens of degrees along the electron beam scan path which requires that the dose correction be updated every microsecond or every few microseconds. These are approximate numbers that depend on the precise pattern being written, the precise e-beam machine used, the nature of the substrate, the required accuracy, resist sensitivity, and other factors.

It is observed that raster scans may increase resist temperatures by temperatures of the order of 20° C., while vector scans may increase resist temperature more than 100° C. The commonly used Novolac resists change their sensitivity with temperature by approximately 0.2% per deg. C. That is, a 20° C. variation in resist temperature will change the resist sensitivity by approximately 4%. This will have a non-trivial blooming effect on e-beam patterns especially for very fine lithography.

Figure 3A:
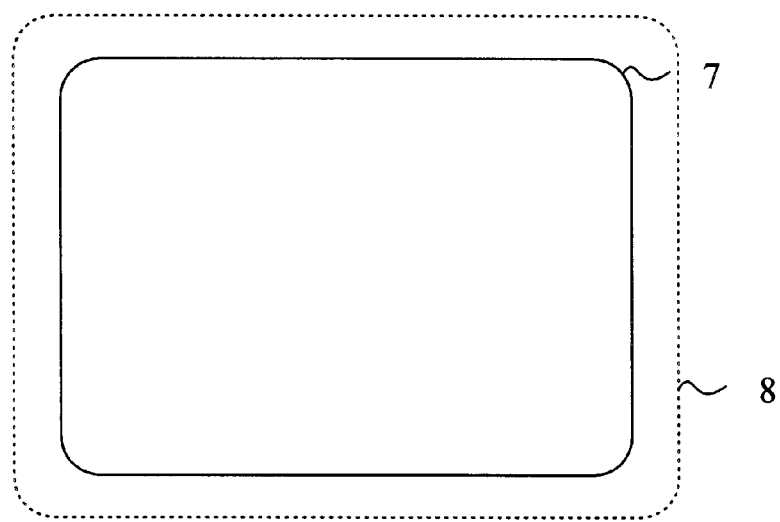
FIGS. 3A, 3B: Schematic top view and side view respectively of regions of exposed resist depicting pattern blooming by overexposure.
Figure 3B:
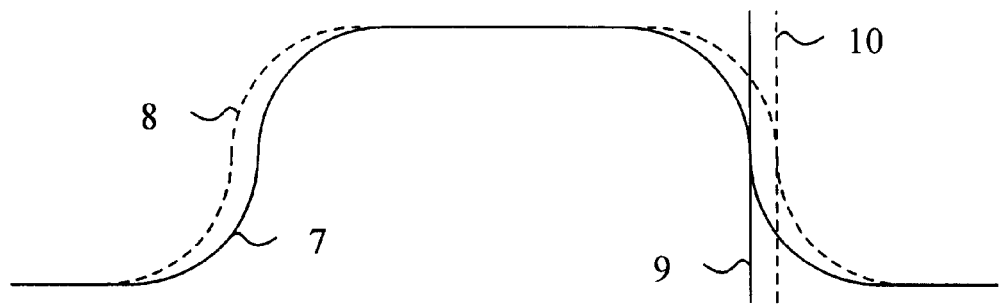

FIG. 3 depicts pattern blooming that will typically result from increasing resist sensitivity. 7 in FIG. 3 depicts the desired pattern of exposed resist in top view (FIG. 3A) and side view (FIG. 3B). The pattern and process designer will plan for e-beam exposure such that exposure point 9 (for example) occurs at the desired pattern boundary. However, increased resist sensitivity may lead to full exposure of resist by less-than-expected e-beam dose. That is, the pattern edge moves to position 10, resulting in a broadened pattern depicted by 8.

Babin and co-workers have discussed the relationship between the effective resist exposure dose of electrons, the incident e-beam current and the resist temperature in SPIE, Vol. 1671, pp. 93–97 (1992). This research indicates that control of e-beam current or exposure duration can be an effective method for controlling resist over-exposure due to heating. Thus, the present invention relates to methods and procedures for determining resist temperature during processing and adjusting process parameters, including reducing the beam current, to compensate for increased resist sensitivity. Typically, the resist temperature rise predicted by the present invention for the point of writing will be multiplied by a factor relating the temperature sensitivity of the resist. The result is a correction applied to the beam current (or dwell time) to provide more accurate resist exposure. The correction will typically be a multiplicative factor less than 1 (0.97 for example) by which the beam current is to be adjusted to correct for resist heating at the point of writing. In an analogous manner, corrections to beam dwell time may be used alternatively or in addition to beam current corrections. Pattern blooming is thereby reduced.

There has been significant research in calculating resist heating for e-beam lithography. Accurate predictions require the use of Monte Carlo simulations to represent single-flash heat sources and various numerical techniques for solving the thermal diffusion equations including finite element, finite difference or elaborate analytical approximations. All such approaches tend to consume large amounts of computer time and are not typically feasible for use in real-time correction of e-beam patterning. The present invention relates to a method for predicting resist heating in a very rapid manner, thereby making it possible to compute resist heating corrections to the e-beam process in real-time as the process proceeds. In principle, it would be possible to calculate resist heating effects for a stipulated e-beam lithography process in advance of actual performance of the process. Thus, one could select a candidate e-beam writing process, specifying all beam and scanning parameters. The resist heating could be calculated using the methods referred to above taking however long may be necessary. The candidate process parameters would then be adjusted to compensate for resist heating effects. If necessary, the cycle of resist heating calculation and parameter adjustment could be iteratively re-done as many times as necessary to converge to a stable set of processing parameters. All of this would be performed off-line (that is, before e-beam lithography begins and typically remote from the e-beam equipment itself). For most applications, this approach is not feasible.

One aspect of the present invention relates to methods for predicting the heating of the resist much more rapidly than previous techniques for the purpose of computing resist heating in real-time as e-beam writing is underway. The primary advantage of real-time evaluation of resist heating is best understood in view of the detailed performance of e-beam lithography equipment (typically raster scan) as used in the manufacture of integrated circuits.

A typical modern integrated circuit (such as Pentium II® or the like) may contain $10^7$ transistors and be fabricated in 20 or more layers of lithography. Each lithography layer requires a mask, typically manufactured by means of e-beam lithography. The chip designer provides a data file containing the information as to how the components are to be arranged on the chip, layer by layer. This data file typically has a format "GDSII" that is hierarchical in format in the interests of economy. For example, if a pattern occurs repeatedly as a component of a larger pattern, the subpattern ("cell") need have its e-beam patterning parameters specified only once. Repeated occurrences of the cell need only be specified by its location and orientation, referring to the already-determined set of lithography parameters. Cells may contain an elementary geometric shape, references to other sub-cells and so on hierarchically. The GDSII structure thus grows hierarchically to define completely the circuit structure from a collection of subsystems, sub-subsystems, etc. down to elementary geometries needed to make mask features for fabricating the most elementary components.

The GDSII file is not organized in a manner that a typical e-beam lithography machine can directly use to write a mask. Therefore, the GDSII file must be "fractured" into individual layers and into the geometrical order in which the e-beam machine will write the masks. "Flat format" is the typical description of the fractured GDSII file, providing in the "flat file" the information for writing the flat lithography masks for use making integrated circuits. Raster scan e-beam machines would typically need to fracture the GDSII file into 1 mm strips for raster scanning, sorted into the order in which they will be written. Vector scan e-beam machines would require a different fracturing.

Flat files are typically very large. For example, if a pixel is 0.1 micron ($10^{-7}$ meter), a 10 cm by 10 cm mask will contain $10^{12}$ pixels. If each pixel requires 1 byte of information to specify the e-beam properties for that pixel, $10^{12}$ bytes (1,000 GByte) would be required to store all the information in flat format. Therefore, fracturing the compact GDSII format into the flat format is typically done as needed in real-time for immediate use by the e-beam writing machine. Resist heating must be calculated from the flat format since, unlike the GDSII format, the flat format contains the information pertaining to the spatial and time order in which the pixels will be written. Prior to fracturing, the GDSII file contains neither the spatial information nor the time information for the e-beam writing in a directly accessible form.

The present invention relates to methods of predicting resist heating in a time scale comparable with the time of e-beam writing. The GDSII file as typically produced by the chip designer is fragmented into the flat format for concurrent use by the e-beam lithography machine and by the method of the present invention.

Resist heating is governed by the classical thermal diffusion equation, Eq. 1

$$(c\partial/\partial t - \kappa \nabla^2) T(r,t) = [P(r,t) * D(\rho)] \qquad \text{Eq. 1}$$

where i is the temperature, r is the position, t is time, c the volumetric heat capacity and $\kappa$ the thermal conductivity of the substrate. $\nabla^2$ is the Laplacian operator. P(r,t) is the pattern exposure sequence, the "coverage," traced by the electron beam in writing the pattern. D($\rho$) is the electron spatial energy diffusion function in the substrate relative to the location of each flash as may be given by an electron diffusion Monte Carlo calculation. $\rho$ is a vector in 3 dimensional coordinate space. [P(r,t)*D($\rho$)] denotes the convolution of P and D. The convolution [P(r,t)*D($\rho$)] may usefully be considered to be the rate of energy deposition per unit volume at specified points in the substrate. [P(r,t)*D($\rho$)] is zero everywhere when the e-beam is turned off.

Equation 1 is well studied in mathematical physics and several techniques for its solution exist, including commercial thermal prediction software such as ANSYS or TEMPTATION. However, prior techniques are much too slow to provide thermal predictions in time to control the e-beam writing process. One way to solve Eq. 1 more rapidly for an entire e-beam pattern is to solve Eq. 1 for a single electron beam flash and linearly superpose the resulting calculated temperature increases resulting from all flashes in the writing sequence. This linear approximation has been found to give temperatures in good agreement those typically encountered in e-beam lithography. For example, temperature rises encountered for raster scanning are typically moderate and no significant error is introduced by assuming that thermal parameters of the material are independent of the temperature. Thus, linear superposition of temperatures is $$T = \Sigma_i K_i P_i \qquad \text{Eq. 2.}$$

where $\Sigma_i$ denotes summation over all i. T in Eq. 2 denotes the temperature rise over ambient temperature at the present point of beam writing. $P_i$ is coverage (the writing) by the e-beam at the $i^{th}$ pattern pixel on a scale of 0 (no e-beam writing) to 1 (fully covered and exposed pixel i). $K_i$ is the "kernel" and denotes the temperature rise at the present point of writing due to a fully covered pixel (P=1) at location i. More generally, the temperature rise at location j in the current beam scan is given as $$T_j = \Sigma_i K_i P_{ij} \qquad \text{Eq. 3}$$

Figure 4A:
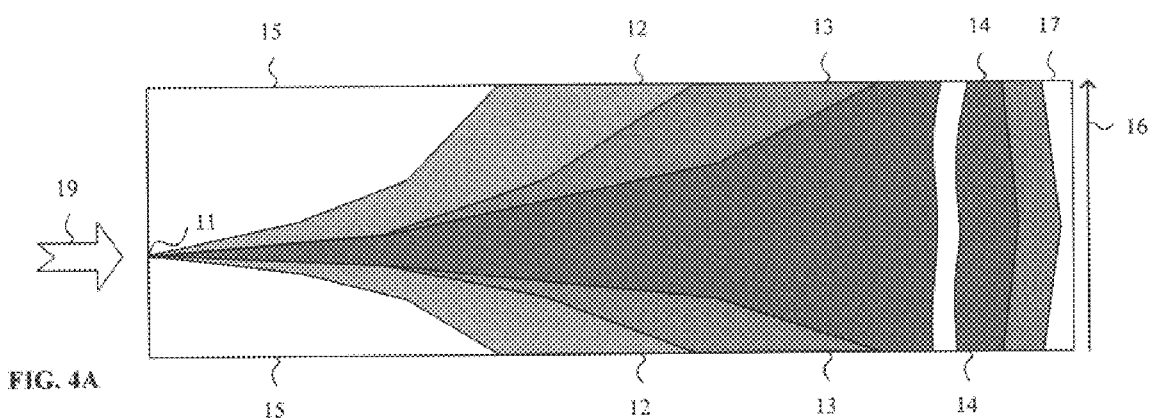
FIGS. 4A, 4B: (A) Depiction of zones of previous writing contributing to the temperature increase of the resist at the current point of writing. (B) Approximation of 4A with sub-stripes.

Typical raster scan machines move the e-beam sufficiently rapidly (approximately 50–100 meters/sec) that the writing e-beam is virtually unaffected by recent flashes deposited in the same beam scan line. High voltage machines deposit substantial beam energy relatively deep within the substrate as depicted in FIG. 2, giving the thermal energy even further to travel before affecting the next pixel written. That is, the e-beam outruns its own heat wave. Therefore, the temperature of the resist being written by the current flash will be virtually unaffected by flashes from the recent past in the same scan line. Flashes in adjacent scan lines in close proximity to the point presently being written are very effective in changing the temperature of the resist. FIG. 4A depicts the current pixel being written, 11, and the regions of prior writing effecting the temperature of the current pixel. Regions 14, 13 and 12 depict regions of prior writing contributing non-negligibly to the temperature rise at the current pixel, 11. Heat deposited in regions 15 does not have time to reach pixel 11 and, therefore, may be ignored in determining the temperature of 11. FIG. 4A depicts the effect that heat deposited in the substrate at relatively distant locations from pixel 11 undergoes substantial dissipation before reaching 11 but more pixels have time to conduct heat to pixel 11. Thus, the dissipation of heat from each distant pixel is compensated in part by the contribution of more such distant pixels, leading to a temperature increase at pixel 11. FIG. 4 depicts heating due to raster scanning with the e-beam scanning in the direction, 16, from bottom to top in FIG. 4A. Thus, the regions effectively conducting heat to pixel 11 are not symmetric about the horizontal, lower regions having more time in which to conduct heat to pixel 11 hence contributing somewhat more to heating. Very remote regions of the resist, 17, dissipate virtually all heat deposited there before conduction to the location of pixel 11 can occur. Therefore, such very remote regions may also be neglected in calculating the temperature rise at the location of the current pixel, 11.

Direct summation of the terms in Eq. 3 may be attempted to calculate the temperature rise at the location of the current pixel. However, it is impractical to perform the numerous calculations needed in a time appropriate for correcting the e-beam writing in real-time processing. Typically, there may be about $10^8$ flashes per $mm^2$ or $10^{10}$ flashes per $cm^2$ resulting in around 1 joule per cm². It is found that the zone of past writing that affects the temperature at the current point of writing may contain of the order of $10^8$ writing pixels. A correction to the e-beam may need to be computed and applied typically every microsecond (or at most every few microseconds). Performing the calculations of Eq. 3 for $10^8$ terms is prohibitive with present computer technology in the time necessary for real-time e-beam control. Typical present computers can calculate roughly 100 to 1000 terms in Eq. 3 in the necessary time. Thus, a reduction of computational time by a factor of about one million is required, without undue loss of accuracy. It is one objective of the present invention to simplify such calculations by a substantial amount, rendering it feasible to perform such calculations in real-time.

Figure 4B:
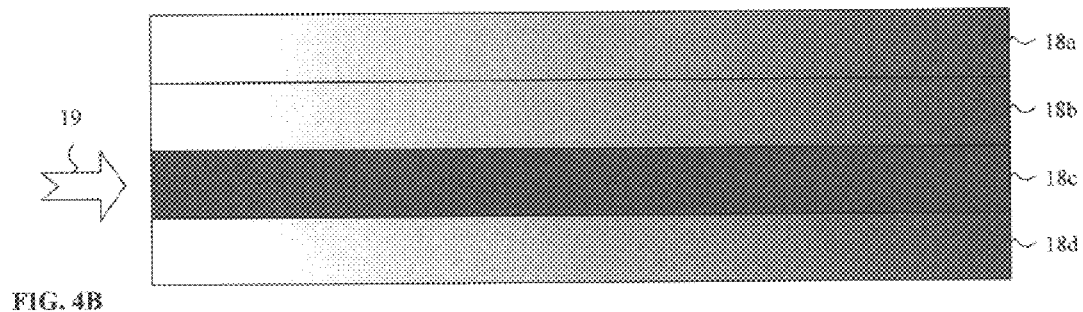
Figure 9:
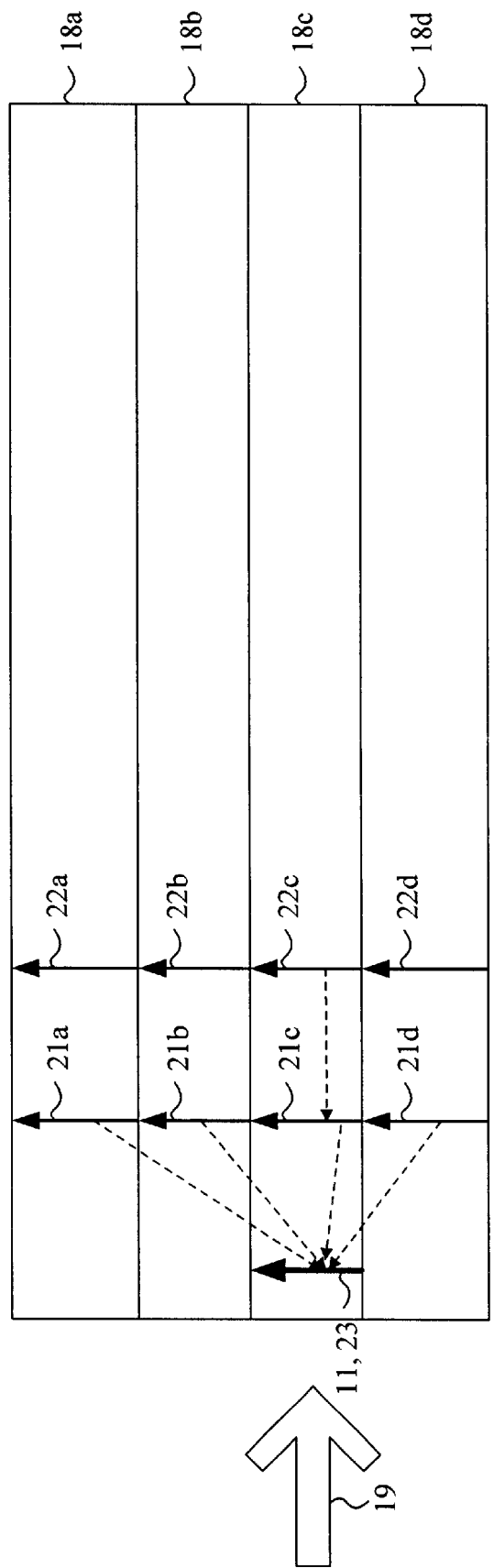
FIG. 9: Schematic diagram of plurality of sub-stripes affecting temperature of current writing location.

FIG. 4A depicts as shaded areas the zones of previously written pattern that make non-negligible contributions to the temperature increase at the location of the present pixel being written, pixel 11 in FIG. 4A. In FIGS. 4A and 4B, and FIG. 9, the electron beam is taken to be a raster scan, scanning in the vertical direction from bottom to top and flyback from top to bottom. Concurrently, the substrate undergoes mechanical translation under the electron beam in the direction of arrow, 19. Hence, lines are written from bottom to top and earlier-written lines lie to the right of later-written lines, as depicted in the figures herein.

It is convenient to discretize the zones written by the electron beam into a plurality of horizontal sub-stripes as depicted as 18a, 18b, 18c and 18d in FIG. 4B (that is, sub-stripes perpendicular to the direction of e-beam scanning). As the electron beam scans in the vertical direction, 16, it traverses the width of each sub-stripe. An objective of the present invention is to calculate the temperature of the resist (hence, its sensitivity) at the time it is written. In most practical applications of e-beam lithography, the temperature is not a rapidly fluctuating function of distance along the beam scan line. Thus, the temperature of the resist immediately prior to writing may usefully be approximated by a single value within each sub-stripe. That is, we treat the entire sub-stripe containing the pixel currently being written (pixel 11, for example) as having a uniform (albeit increased) temperature. Similarly, the contribution to the increased temperature at the pixel currently being written due to previous writing is also treated as uniform within each sub-stripe of previously written pattern. This discretization of the previously written zone into sub-stripes achieves an adequate degree of accuracy at greatly reduced computational effort. The choice of 4 sub-stripes depicted in FIG. 4A is for convenience only. A different or larger number of sub-stripes may be used if the increased accuracy of more sub-stripes is worth the increase in computational effort. In practice, it is found that sub-stripes containing 1000–2000 pixels provide useful accuracy in comparison with accurate calculations in typical cases, but with a significant reduction in computational effort. Fewer pixels, 100–200 for example, may also be grouped into each sub-stripe for increased accuracy. In practice, typically eight sub-stripes are found to give sufficient accuracy although as few as four may be sufficient in some cases.

The present invention is not inherently limited to a specific number or size of sub-stripes and more or less may be employed to achieve the desired balance between numerical accuracy and speed of computation. It is convenient, but not an inherent limitation of the present invention, that each sub-stripe contain the same number of pixels (that is, have the same width). Non-uniform sub-stripes will introduce additional complexity into the computational procedures but do not make the present approach to resist heating calculation inoperable or infeasible.

To be definite, we will focus our detailed description on the case of raster scanning of the e-beam over the substrate. However, serpentine scanning shares an important characteristic with raster scanning, namely the e-beam scans in both cases in a definite pattern over the substrate at a known speed. This scanning predictability in pattern and speed means that the location of two pixels on the substrate determines the time interval between their writing. (By "writing" we mean directing the e-beam toward the pixel "to be written" and causing the appropriate intensity to impinge on that pixel, including the case in which the beam is "blanked" causing zero intensity to strike the pixel being "written.")

FIG. 9 depicts a line segment currently being written, 23, within a particular sub-stripe, 18c. To be precise, by "currently being written," "current segment" and the like we mean the collection of pixels immediately prior to their being written by the e-beam. The resist sensitivity is to be determined at the time of writing, which means sufficiently close to the commencement of writing that no temperature change has time to occur until actual writing begins. As noted above and depicted on FIG. 4A, the current scan line can be neglected in determining temperature of the current segment. For purposes of resist heating pursuant to the present invention, segment 23 is indistinguishable from what we previously called "pixel 11," and is so noted on FIG. 9. Writing a segment of typically 1,000 distinct pixels will result in beam energy being deposited in all pixels of the segment, in none of the pixels of the segment, or in some pixels of the segment. For purposes of calculating resist heating pursuant to the present invention, it is convenient to treat the line segment within each sub-stripe as a single super-pixel into which has been deposited the known amount of energy determined by summing the actual pixel-by-pixel energy deposition within the segment. That is, for purposes of calculating resist heating, each sub-segment is treated as a uniform entity receiving some fraction $\alpha$ of the total energy that would be deposited if all pixels in the segment received maximum e-beam exposure ($0 \leq \alpha \leq 1$), neglecting variations within each sub-stripe. As noted, smaller sub-stripes may be used to increase accuracy for those cases in which the assumption of a uniform temperature within each sub-stripe requires a smaller number of pixels. FIG. 9 also depicts the line previously written as broken into sub-stripes, 22a, 22b, 22c, 22d. (FIG. 9 is not drawn to scale, but rather the distances therein are drawn for ease of depiction and explanation.)

Figure 10:
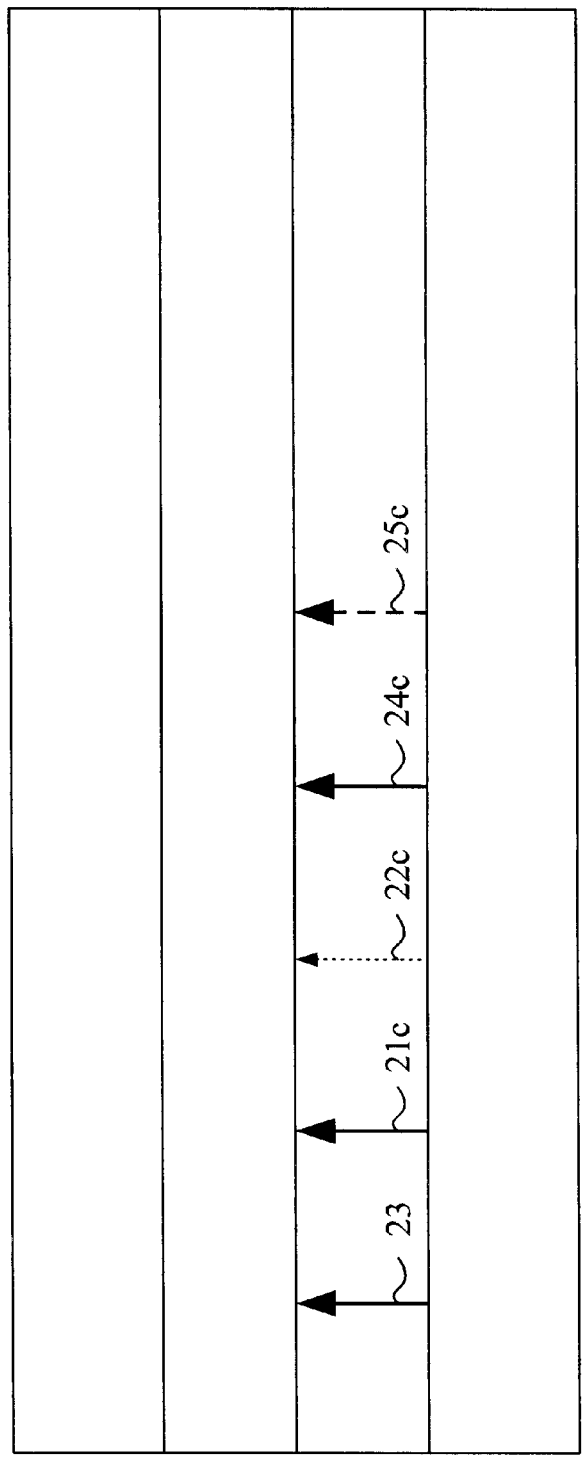
FIG. 10: Schematic diagram of multiple scan lines, single sub-stripe.

FIG. 10 depicts a sequence of line segments that would be written in the order 25c, then 24c, 22c, 21c, 23. Of course, after writing line 25c, the e-beam would continue writing to the upper edge of its scan line, flyback to the bottom and write from the bottom of its scan range up to segment 24c before commencing the writing of 24c. However, the present invention is best explained in terms of writing a sequence of adjacent line segments as depicted in FIG. 10, temporarily avoiding the complications introduced by the writing occurring between the end of 25c and the beginning of 24c (for example). The modifications of the present invention necessary to account for the writing of the entire edge-to-edge line will be described later.

Figures 5A, 5B:
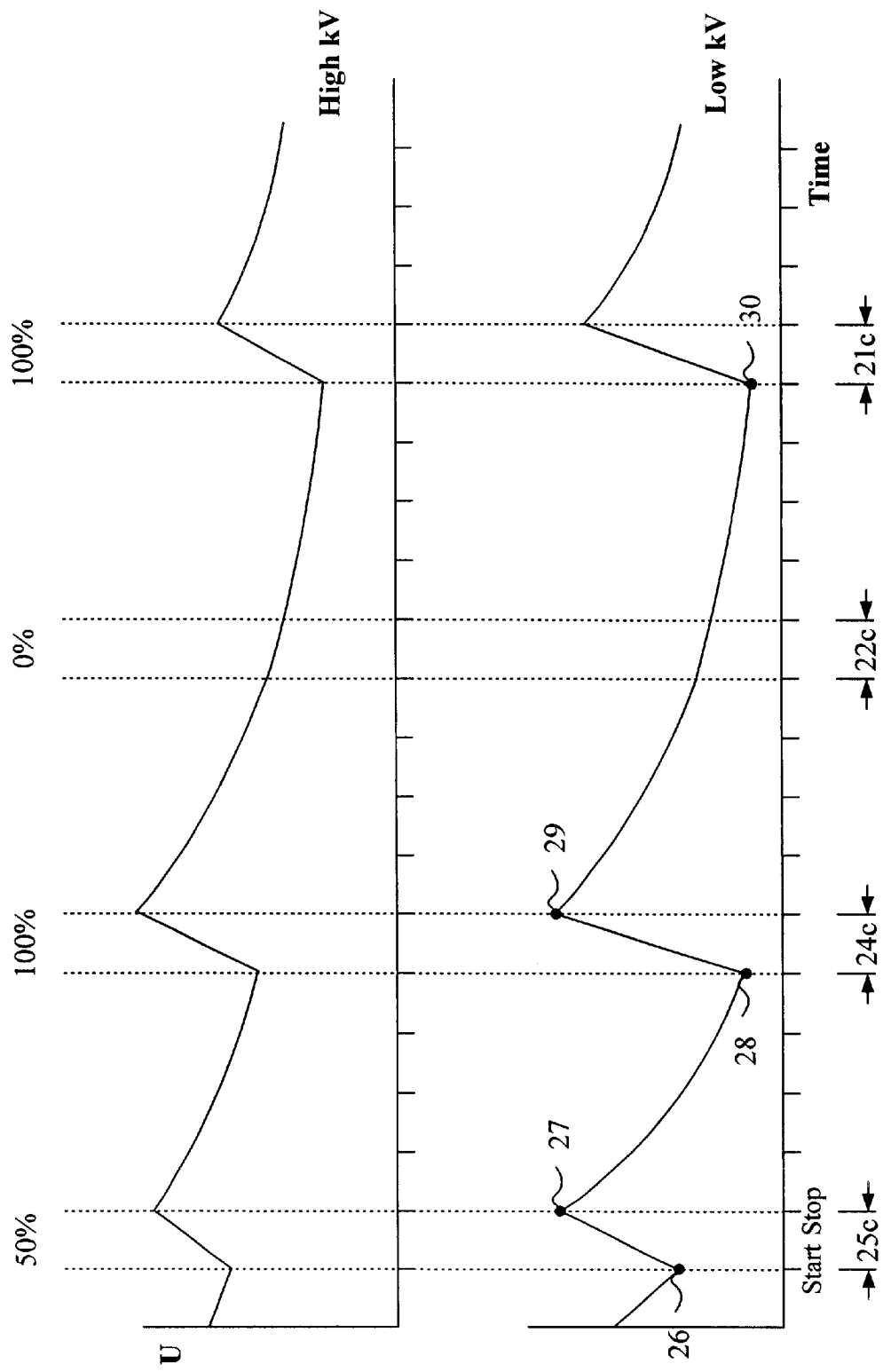
FIGS. 5A, 5B: Charge and discharge of capacitor describing heat transfer for high e-beam voltages (A), and low e-beam voltages (B).

FIG. 5 depicts the temperature of the resist at the location of the immediately adjacent (and yet to be written) segment due to previous writing. That is, from the start to the stop of 25c, the vertical axis in FIG. 5 depicts the temperature at the location of segment 24c (assumed uniform within the segment). FIGS. 5A and 5B depict the temperature behavior due to high voltage e-beams and low voltage e-beams respectively. The effects relevant to the present invention described herein are essentially the same for both high voltage and low voltage beams. As noted above, high voltage beams deposit energy deeper into the substrate away from the resist, leading to less dramatic temperature increases during writing. For simplicity of description, we describe only one of the curves in FIG. 5, namely 5B.

At the start of writing of line 25c, the temperature of line 25c is the point labeled 26 in FIG. 5B. Assuming uniformity of temperature, this is the temperature of the resist that is used to correct for the writing of line 25c. The energy deposited during the writing of line 25c does not effect the temperature of this line segment during the writing, so temperature 26 is the proper temperature for evaluating resist sensitivity at the location and time of writing line 25c. However, the temperature of the immediately adjacent line, 24c is approximately the same as line 25c at the start of writing line 25c and is effected by the heat deposited in writing line 25c. This is depicted by the "start" and "stop" points for the writing of line 25c. Depicted on the vertical axis in FIG. 5 is the temperature of line 24c as affected by writing line 25c. As depicted, the temperature at the location of line 24c increases to point 27 during the writing of line 25c. Since (for example) we assume that line 25c is written only 50% of maximum (that is, $\alpha$=0.50), the temperature increase is not as large as it would be if a larger fraction of line 25c actually received electron impact. The fractional exposure can be anything from 0% to 100% and we depict 0, 50% and 100% herein merely for purposes of illustration, not limitation.

From the "stop point" for line 25c, we assume for purposes of illustration only that no further writing occurs until the e-beam has flown back and is positioned to begin writing line segment 24c. (Alternatively, for purposes of illustration we may assume that the line segments depicted in FIG. 10 are the entire edge-to-edge pattern). During this time interval, the temperature at line 24c decreases due to conventional thermal diffusion. Thus, when the e-beam is repositioned to begin writing line segment 24c, the temperature of the resist is 28. Therefore, this temperature 28 is the proper value to be used in determining the resist sensitivity and, hence, the correct exposure conditions for writing line 24c. For the example of line 24c being fully written, the temperature at the adjacent line will rise to 29 before dissipating during the interval in which the e-beam is re-positioning to write line 22c. Assuming line 22c is completely blank ($\alpha$=0), no temperature rise occurs and temperature continues to dissipate to temperature point 30. Temperature 30 is the temperature of the resist at the commencement of writing segment 21c and is thus the value to be used in correcting the e-beam writing parameters for precise exposure.

FIG. 5 depicts the temperature behavior for the simplified case of writing entirely within one sub-stripe. However, it serves to illustrate one of the important objectives achieved by the present invention. The present scheme for determining resist heating makes use of only a few parameters; the temperature of the prior segment just prior to its writing, the amount of heating caused by writing the segment immediately preceding the present segment, and the dissipation of heat at the location of the present segment during the time since the prior segment was written. In fact, by using an iterative scheme from the writing of the every first line, only two parameters are necessary, the temperature rise occurring from writing a line segment ($\Delta T$) and the time constant for decay, $\delta$, approximating the decay depicted in FIG. 5 as an exponential time decay $e^{-\delta \tau}$. Thus, the temperature of each successive line can be computed as $$T_i = [T_{(i-1)} + \alpha \Delta T] e^{-\delta \tau} \quad \text{Eq. 4}$$

where $\alpha$, $\Delta T$ and $\delta$ are as previously defined, $\tau$ is the decay time from the end of writing one segment to the beginning of writing the next successive segment, as depicted in FIG. 5. i=1, 2,3, . . . total number of lines written.

$T_0$ is the ambient temperature of the resist prior to the writing of any lines. Thus, $T_0$ is known from the properties of the resist prior to writing and $\alpha$ is readily accumulated from knowledge of the e-beam blanking. $\Delta T$ and $\delta$ relate to the thermal properties of the materials (heat capacity, thermal conductivity) and not to the details of the pattern being written. Thus, calibration to determine $\Delta T$ and $\delta$ need be performed only once.

Eq. 4 relates to the special case of a single sub-stripe depicted in FIG. 10. Generalization to several parallel sub-stripes as depicted in FIG. 9 is straight-forward. The temperature contribution from each segment, a, b, c, d, etc. contributes to the present writing with a multiplicative factor determined in a calibration step (typically performed by calibration against an accurate Monte Carlo or other numerical result). Thus, the temperature at segment 23 is the sum over sub-stripes (4 in FIG. 9) of the immediately preceding line and no others. Thus, for the case depicted in FIG. 9, we have $T(\text{at segment } 23) = K_a[T(@21a) + \alpha(@21a)\Delta$ $T]e^{-\delta \tau(\text{since } 21a)} + K_b[T(@21b) + \alpha(@21b)\Delta$ $T]e^{-\delta \tau(\text{since } 21b)} + K_c[T(@21c) + \alpha(@21c)\Delta$ $T]e^{-\delta \tau(\text{since } 21c)} + K_d[T(@21d) + \alpha(@21d)\Delta T]e^{-\delta \tau(\text{since } 21d)}$ Eq. 5

Equation 5 is easily generalized to many sub-stripes and combined with the iterative technique of Eq. 4 as $$T_i^{(m)} = \Sigma_{(n)} [T_{(i-1)}^{(n)} + \alpha(n)\Delta T] e^{-\delta \tau(n)} \quad \text{Eq. 6}$$

where (m) and (n) range over the sub-stripes for each e-beam line written and $\tau$(n) denotes the time since writing sub-segment (n). Thus, Eq. 6 of the present invention permits the replacement of potentially millions of arithmetic operations required to evaluate Eq. 4, with just a few required to evaluate Eq. 6. Since Eq. 6 is iterative, the required temperature of the resist is computed "on the fly" as needed as the e-beam scans across the substrate and mechanical translation of the substrate also takes place. Thus, the iterative method presented herein for calculating resist heating of photoresist during e-beam lithography is sufficiently simple that straight-forward digital implementation on FPGA's, DSP's or various microprocessors may be performed by ordinarily skilled engineers. However, an analogue implementation is also within the scope of the present invention, making use of the similarity in behavior between thermal decay and the charging and discharging of a capacitor through a resistive load.

Figure 6:
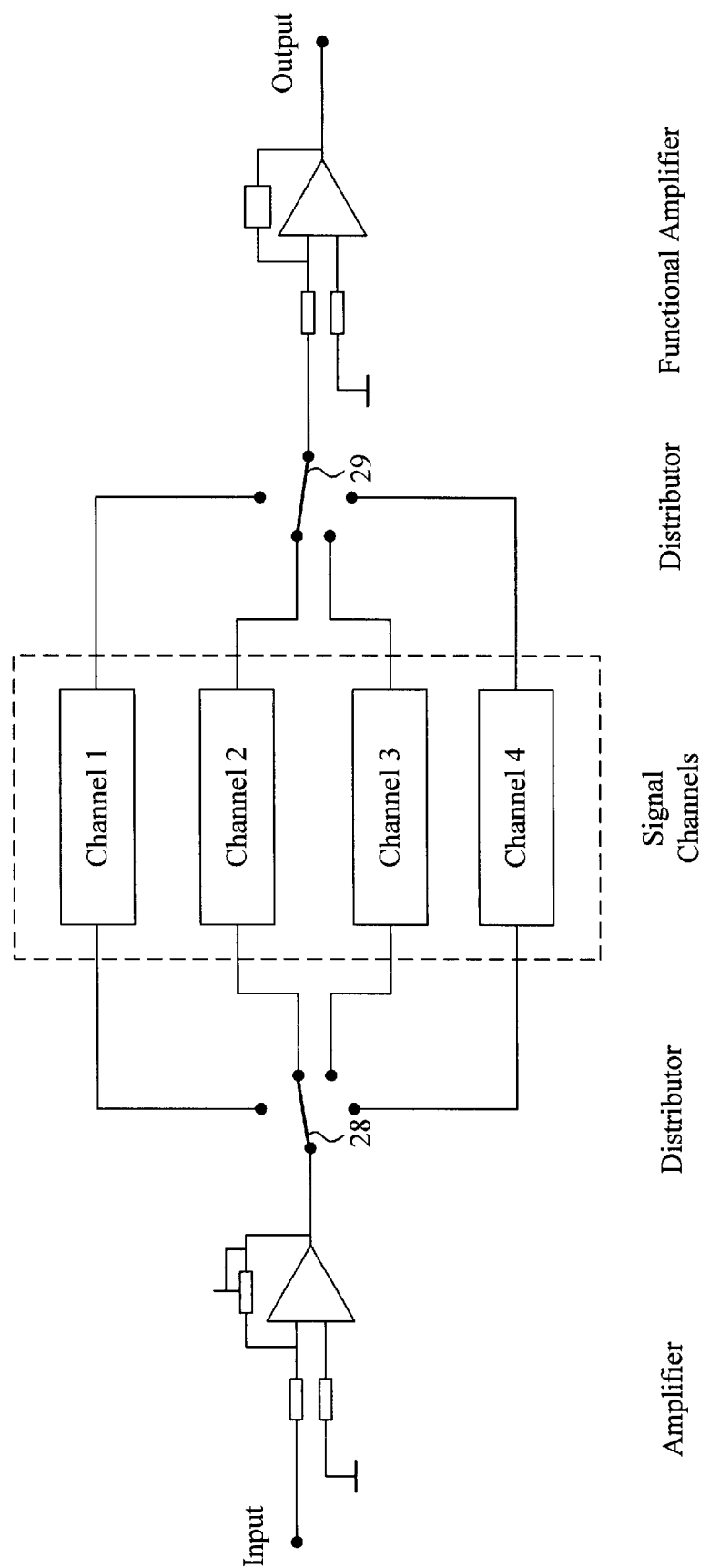
FIG. 6: Schematic block diagram of analogue implementation of proximity resist heating methods.
Figure 7:
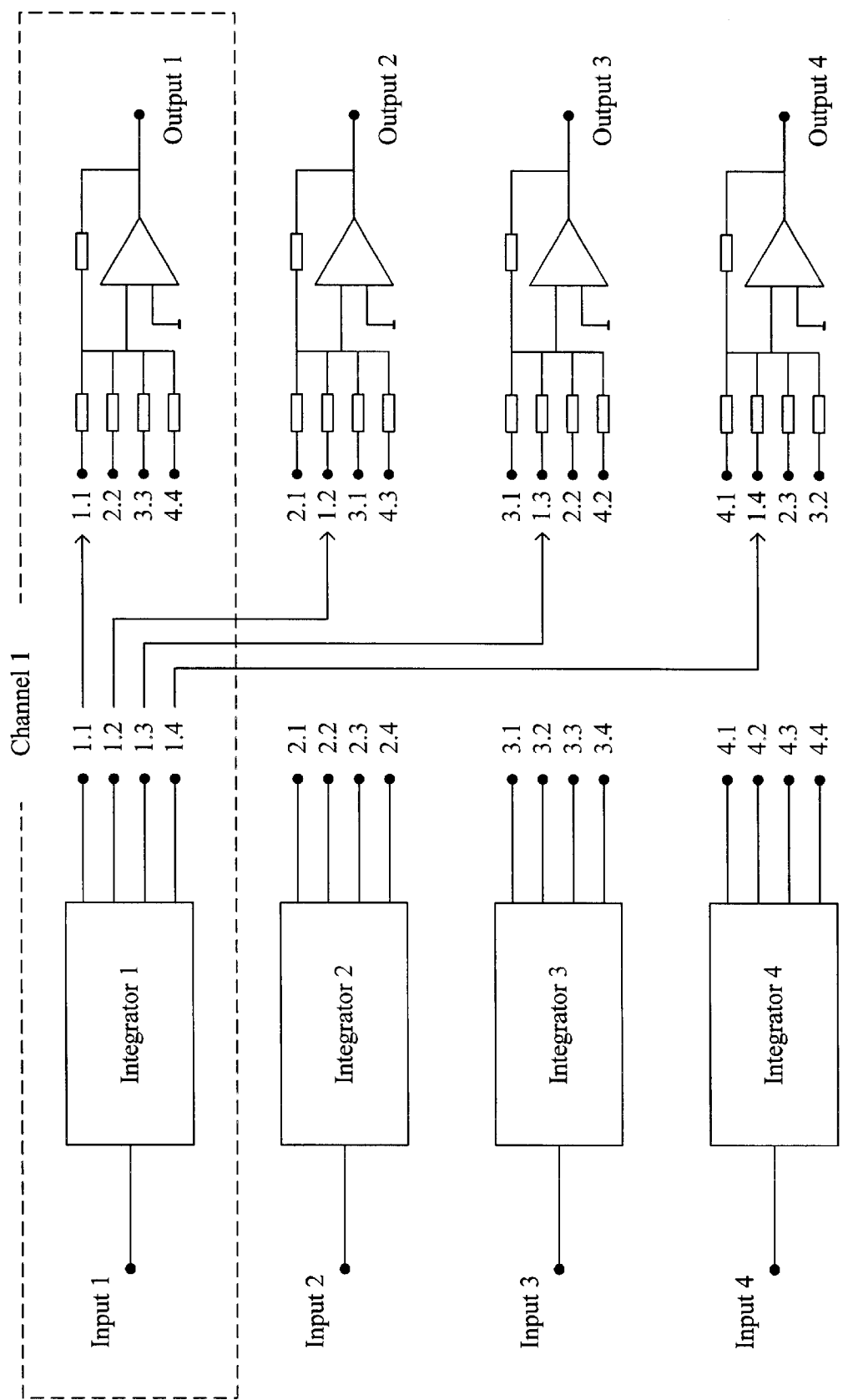
FIG. 7: Schematic block diagram of channel circuitry for analogue implementation of methods of present invention.
Figure 8:
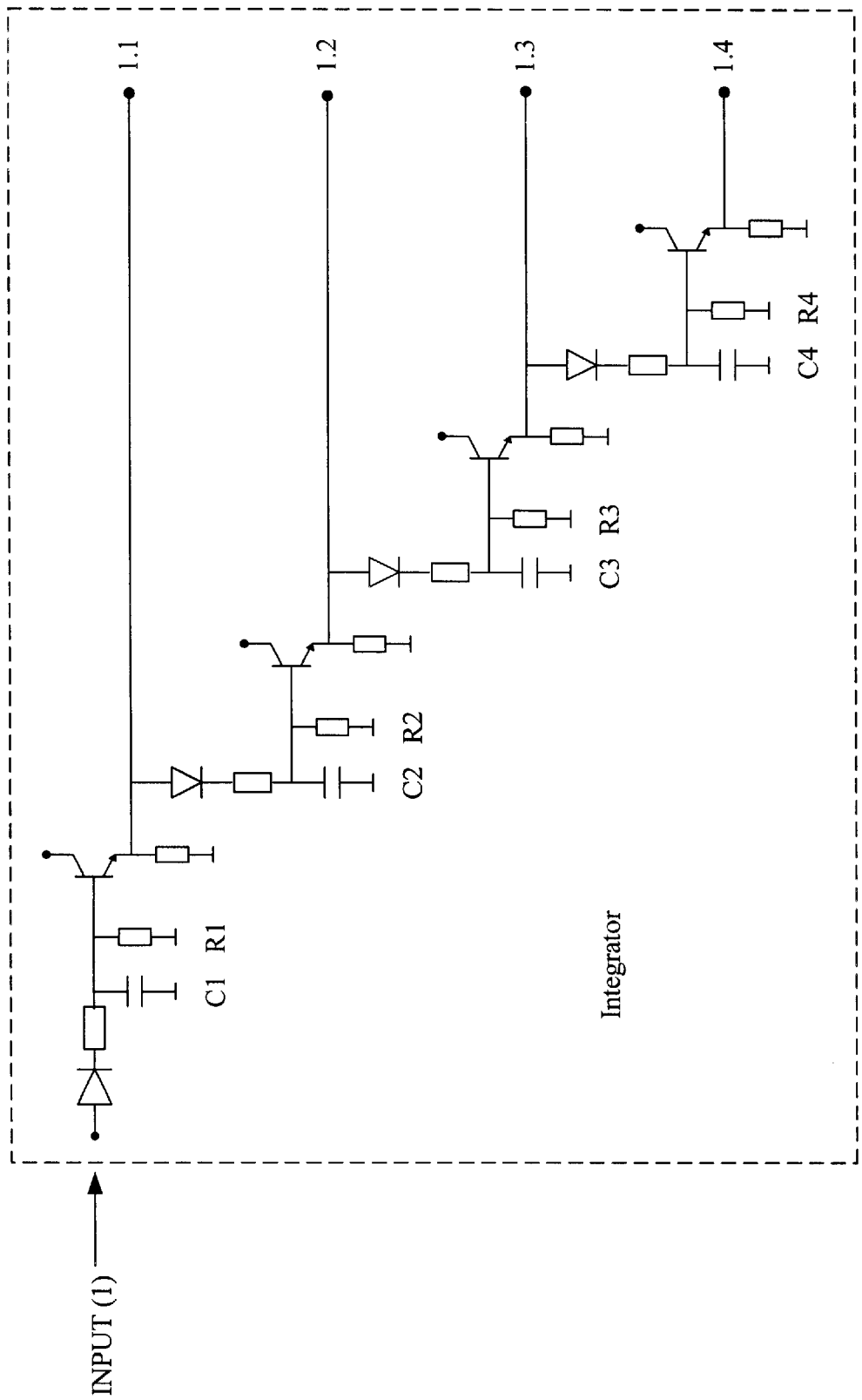
FIG. 8: Schematic diagram of integrator circuit.

The temperature behavior depicted in FIG. 5, and the exponential decay of Eq. 6, can be evaluated by means of an analogue circuit in which the charging of a capacitor corresponds to the temperature rise and its discharge through a resistor simulates the decay. One embodiment is depicted in FIGS. 6–8 for the case of four sub-stripes. Generalization to a different number of sub-stripes is straight-forward. Information is required concerning the thermal properties of the substrate, which is typically obtained in a calibration step.

Also, the calculation requires information pertaining to the energy deposited in the substrate during the writing of each sub-stripe. This may be obtained from any (or any combination) of several places within the electron beam column. Electric current from the backscatter detector is one convenient source for the information on the e-beam writing of a particular sub-stripe (in effect, determining a). Similar information may be obtained from other locations within the electron beam column, such as the sequencer.

FIG. 6 depicts four channels 1–4 corresponding to the four sub-stripes considered in the examples herein. After initial amplification, the signal from the e-beam column goes through the first arm of the distributor, 28 in FIG. 6. Distributor 28 transmits the input current to the appropriate channel selecting the sub-stripe presently being written. Current is moved by distributor 28 from channel to channel as the e-beam traverses its writing path. Distributor 29 is synchronized with distributor 28 such that 28 and 29 point to the same channels and switch at the same time. The input signal through 28 passes through the selected channel (channel 2 in FIG. 6). The output signal from the selected channel (channel 2 in FIG. 6) takes into account heating from all previous writings. Each channel provides an output signal that is proportional to the temperature at the sub-stripe currently being written. This output signal is directed to a functional amplifier which provides an electrical signal for controlling the writing parameters of the e-beam.

This input signal received by distributor 28 and directed to a particular channel (channel 2 in FIG. 6), revises the contents of Channel 2 (as described below) to account for the additional energy deposited by writing Channel 2 of the present (i'th) scan line. The output from Channel 2 through distributor 29 is the heat at the present scan line due to all previous scan lines (1, 2, . . . i−1). The output signal through 29 is related to the temperature of the resist at the current sub-segment (Channel 2) in the current scan line i.

The Signal Channel (1–4 in FIG. 6) consists typically in one embodiment of two functional components, an integrator and summing amplifier as depicted schematically in FIG. 7. The integrator receives an amplified input signal from the e-beam column (such as backscattering detector or equivalent source of information about the instantaneous e-beam exposure) and integrates this signal over time and provides several output signals, one for each sub-stripe. The function of each output determines the effect of writing sub-stripe i (the input line) on the temperature of the resist at sub-stripe j (the output line). Thus, the output signal denoted as i.j in FIG. 7 (i,j=1, 2, 3, 4) represents the effect of writing sub-stripe i on the temperature of sub-stripe j. The summing amplifier depicted in FIG. 7 receives as input the output from the appropriate integrator as indicated. Thus, the output of channel 1 (for example) provides the temperature at sub-stripe 1 due to all previously-written lines determined via sub-stripes 1, 2, 3 and 4 respectively. At the same time, the input updates the temperature accounting for the temperature rise due to the current writing of the present scan line.

FIG. 8 provides an example of one circuit that may be used as the integrator. An electrical pulse corresponding to the temperature rise during the writing of a single sub-stripe is presented to the INPUT(1) in FIG. 8, corresponding to the energy deposited in writing one sub-stripe. The magnitude and duration of this input pulse is chosen proportional to the magnitude and duration of temperature rise caused by e-beam impact with the substrate. In the typical case, the time for writing every sub-stripe during raster scanning is the same, then each input pulse will have the same duration. The magnitude of the pulse will vary to depict the appropriate fraction of the sub-stripe actually receiving e-beam energy ($\alpha$). Thus, capacitor $C_1$ is charged proportional to the temperature rise occurring in a sub-stripe due to e-beam writing. Upon cessation of the pulse, $C_1$ will discharge through resistor $R_1$, duplicating the behavior depicted in FIG. 5. A diode may optionally be interposed between capacitor $C_1$ and the input pulse to prevent unwanted discharge of $C_1$ back into the input circuitry. INPUT(1) in FIG. 8 relates to the energy deposited in the first sub-stripe ($\alpha$) as it is written. Such data is typically available in e-beam machines from many places in the electron beam column including from electron backscatter and/or blanker, yielding real-time information on the energy deposited in that sub-stripe, hence determining $\alpha$. Thus, $C_1$ accumulates energy corresponding to the writing of the first sub-stripe. The output from channel (sub-stripe) 1 in writing scan line i has an effect on the temperature of sub-stripe 1 in scan line (i+1) given by output line 1.1 in FIG. 8. The writing of sub-stripe 1 in scan line i also has an effect on the temperature of channels 2, 3, etc. in scan line (i+1). However, the effect on these other channels must be scaled by the appropriate factor to account for the different separation of sub-stripes in adjacent scan lines, as depicted in FIG. 9. Thus, capacitors $C_k$ (k=2, 3, 4) accumulate different amounts of charge from $C_1$ to account for this separation. This is taken into account by means of the resistor in series with the input into each capacitor, depicted in FIG. 8. The output from each capacitor leads to the various output channels i, j.

The parameters needed in the above calculation, Eq. 6, may be determined by comparison with accurate TEMPTATION, ANSYS or other numerical procedures for solving the diffusion equation, Eq. 1. Comparison with accurate calculations may also be used to determine the capacitance values and resistance values required in the analogue circuit implementation also described herein.

Figure 11A:
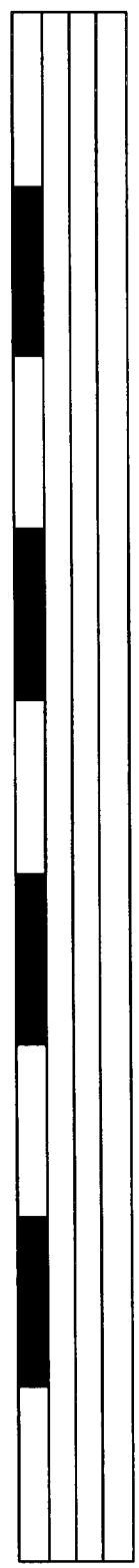
FIG. 11: Example of writing sequence for experimental calibration of the methods of the present invention.
Figure 11B:
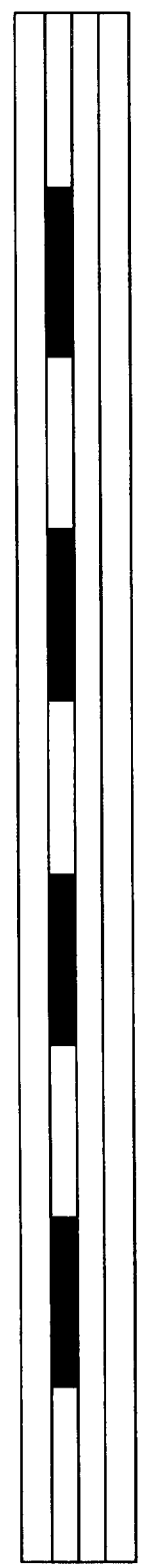

In addition to comparison with accurate calculations, the parameters necessary to implement the present methods in digital or analogue form may be derived from experimental measurements. An example of such an experimental calibration is depicted in FIG. 11. A first test pattern is written consisting of an intermittent pattern of fully exposed and fully unexposed sub-stripes, each having a length from about 0.2 mm to 0.6 mm. This is depicted in FIG. 11a. All other sub-stripes are empty (that is, full unexposed). Resistor $R_1$ is detached from the circuit of FIG. 8 and capacitor $C_1$ has its capacitance adjusted such that the rise of the output signal detected at 1.1 corresponds to the value required to fit accurate experimental or numerical values. $R_1$ is re-attached and the beam is blanked. The output signal at 1.1 decreases and the resistance of $R_1$ is adjusted to fit the observed (or accurately calculated) decrease in the output signal. The above sequence of steps is repeated for the test pattern depicted in FIG. 11b, resulting in determination of the capacitance for the capacitor $C_1$ and the resistance of resistor $R_1$, both as used in connection with Channel 2. Every sub-stripe is calibrated in a similar manner. The above steps are repeated to determine $C_2$ and $R_2$ for all sub-stripes (Channels). Repetition of the above sequence of steps leads to the determination of all resistance and capacitance values for all channels.

Having described the invention in detail, those skilled in the art will appreciate that, given the present disclosure, modifications may be made to the invention without departing from the spirit of the inventive concept described herein. Therefore, it is not intended that the scope of the invention be limited to the specific and preferred embodiments illustrated and described. Rather, it is intended that the scope of the invention be determined by the appended claims.

We claim:

1. A method of predicting the temperature rise of a resist during lithography due to previously written pixels, comprising:
    a) combining said previously written pixels into a plurality of adjacent sub-stripes wherein the long axis of said sub-stripes is substantially perpendicular to the direction of beam scanning; and,
    b) approximating the temperature rise due to all pixels within each of said sub-stripes with a single value; and,
    b) predicting said resist temperature at the point of a beam current writing from the thermal decay constant, the temperatures and locations of prior sub-stripes.

2. A method as in claim 1 wherein said sub-stripes contain equal numbers of pixels.

3. A method as in claim 1 wherein said sub-stripes contain from approximately 1000 to approximately 2000 pixels.

4. A method as in claim 1 wherein said plurality of sub-stripes comprises eight sub-stripes.

5. A method of correcting energy beam lithography for resist heating comprising:
    a) predicting the temperature rise of the resist as in claim 1; and,
    b) determining the change in resist sensitivity due to said temperature rise; and,
    c) adjusting the beam dose by the proper amount to compensate for said change in resist sensitivity.

6. A method of correcting energy beam lithography for resist heating as in claim 5 wherein said adjusting of said beam dose comprises adjusting said beam current.

7. A method of correcting energy beam lithography for resist heating as in claim 5 wherein said adjusting of said beam dose comprises adjusting a beam dwell time.

8. An apparatus for predicting the temperature rise of a resist during lithography comprising:
    a) an input signal corresponding to the energy delivered to a sub-stripe as said sub-stripe is written; and,
    b) a distributor configured to direct said input sequentially to a plurality of channels, each of said channels corresponding to each of said sub-stripes, wherein each of said channels comprises a capacitive-resistive integrator configured to charge proportionately as a sub-stripe is heated and discharge proportionately as said heat dissipates, and,
    c) an output signal corresponding to the temperature rise at a present pixel being written.

* * * * *